United States Patent
Durrett et al.

(10) Patent No.: US 10,040,723 B2
(45) Date of Patent: Aug. 7, 2018

(54) CERAMIC MICROSPHERE THERMAL BARRIER COATING

(71) Applicant: GM GLOBAL TECHNOLOGY OPERATIONS LLC, Detroit, MI (US)

(72) Inventors: Russell P. Durrett, Bloomfield Hills, MI (US); Paul M. Najt, Bloomfield Hills, MI (US); Peter P. Andruskiewicz, IV, Ann Arbor, MI (US); Gary P. Hill, Sunland, CA (US); Tobias A. Schaedler, Oak Park, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 100 days.

(21) Appl. No.: 15/230,675

(22) Filed: Aug. 8, 2016

(65) Prior Publication Data

US 2018/0037510 A1 Feb. 8, 2018

(51) Int. Cl.
| | | |
|---|---|---|
| *B32B 5/16* | (2006.01) |
| *G11B 11/105* | (2006.01) |
| *B32B 17/10* | (2006.01) |
| *G11B 5/64* | (2006.01) |
| *C04B 35/622* | (2006.01) |
| *C23C 16/56* | (2006.01) |

(52) U.S. Cl.
CPC ........ *C04B 35/62222* (2013.01); *C23C 16/56* (2013.01); *C04B 2235/528* (2013.01)

(58) Field of Classification Search
CPC .......... C04B 35/6222; C04B 2235/528; C23C 16/56
USPC ................................. 428/331, 332, 334, 336
See application file for complete search history.

(56) References Cited

U.S. PATENT DOCUMENTS

2013/0302526 A1* 11/2013 Fish .................. C09D 5/18
427/397.7

* cited by examiner

*Primary Examiner* — William K Cheung
(74) *Attorney, Agent, or Firm* — Quinn IP Law

(57) ABSTRACT

A thermal barrier coating for a component includes an insulating layer applied to a surface of a substrate. The insulating layer comprises a plurality of ceramic microspheres. A sealing layer is bonded to the insulating layer. The sealing layer is non-permeable such that the sealing layer seals against the insulating layer. A method for applying a thermal barrier coating to a surface of a substrate of a component includes providing a plurality of ceramic microspheres and applying the plurality of ceramic microspheres to the surface of the substrate. At least one heat treatment is applied to the plurality of ceramic microspheres on the surface of the component to create an insulating layer on the surface of the substrate.

9 Claims, 2 Drawing Sheets

CERAMIC MICROSPHERE THERMAL BARRIER COATING

TECHNICAL FIELD

The present disclosure relates to a thermal barrier coating for an internal combustion engine.

BACKGROUND

Some vehicles include an engine assembly for propulsion. The engine assembly may include an internal combustion engine and a fuel injection system. The internal combustion engine includes one or more cylinders. Each cylinder defines a combustion chamber. During operation, the internal combustion engine combusts an air/fuel mixture in the combustion chamber in order to move a piston disposed in the cylinder.

Maintaining temperature environments in engine assemblies may be limited based upon the configuration of the engine assembly and the functions of various components. Uneven temperature distributions can affect the efficiency of components. In internal combustion engines, coatings insulate the hot combustion gas from the cold, water-cooled engine block, to avoid energy loss by transferring heat from the combustion gas to the cooling water. Further, during the intake cycle, the coatings should cool down rapidly in order to not heat up the fuel-air mixture before ignition.

SUMMARY

A thermal barrier coating comprises an insulating layer applied to a surface of a substrate. The insulating layer comprises a plurality of ceramic microspheres. A sealing layer is bonded to the insulating layer. The sealing layer is non-permeable such that the sealing layer seals against the insulating layer.

The insulating layer of the thermal barrier coating may have a porosity of at least about 75% and a thickness of between about 50 microns and about 1 millimeter. The insulating layer may further comprise a matrix material configured to bond with the plurality of microspheres.

The matrix material further comprises boron trioxide, aluminum oxide, aluminum silicate, silica, or silicate glass or mixtures thereof that fuse together with the spheres, particles consisting of the group selected from metals, metal alloys and metal nitrates such as aluminum, aluminum alloy or aluminum nitrate that oxidize to the metal oxide during heat treatment of the insulating layer, or a preceramic polymer consisting of the group selected from siloxanes, silanes, carbosilanes, silazanes and borosilanes that converts to a ceramic on heat treatment of the insulating layer.

The sealing layer may comprise one or more elements selected from the group consisting of aluminum oxide, aluminum silicate, silicon oxide, silicate glass or mixtures thereof, high temperature metals and metal alloys including nickel, cobalt, iron, chromium, refractory metals and corresponding alloys. Alternatively, the sealing layer may be formed from a preceramic polymer that comprises one or more elements selected from the group consisting of siloxanes, silanes, carbosilanes, silazanes and borosilanes, wherein the preceramic polymer converts to a ceramic upon heat treatment of the insulating layer.

The plurality of ceramic microspheres further comprise about 0 percent by weight to about 100 percent by weight of silicon oxide and about 0 percent by weight to about 100 percent by weight of aluminum oxide. Alternatively, the plurality of ceramic microspheres further comprise about 50 percent by weight to about 70 percent by weight of silicon oxide and about 30 percent by weight to about 50 percent by weight of aluminum oxide. The sealing layer has a thickness of between about 1 microns and about 20 microns.

In another embodiment of the disclosure, a method for applying a thermal barrier coating to a surface of a substrate of a component includes providing a plurality of ceramic microspheres. The plurality of ceramic microspheres may be sorted such that ceramic microspheres are selected for use. Particles of a matrix may be added to the selected microspheres. Particles may include a variety of mixtures and may be added at a weight fraction of about 5% by weight to about 50% by weight of the microspheres. At least one heat treatment is applied to the plurality of ceramic microspheres and matrix on the surface of the component. In one embodiment, the step of providing the plurality of ceramic microspheres further comprises sorting and selecting ceramic microspheres having a diameter of about 10 microns to about 50 microns. The above features and advantages and other features and advantages of the present disclosure are readily apparent from the following detailed description of the best modes for carrying out the disclosure when taken in connection with the accompanying drawings.

DETAILED DESCRIPTION

Figure 1:
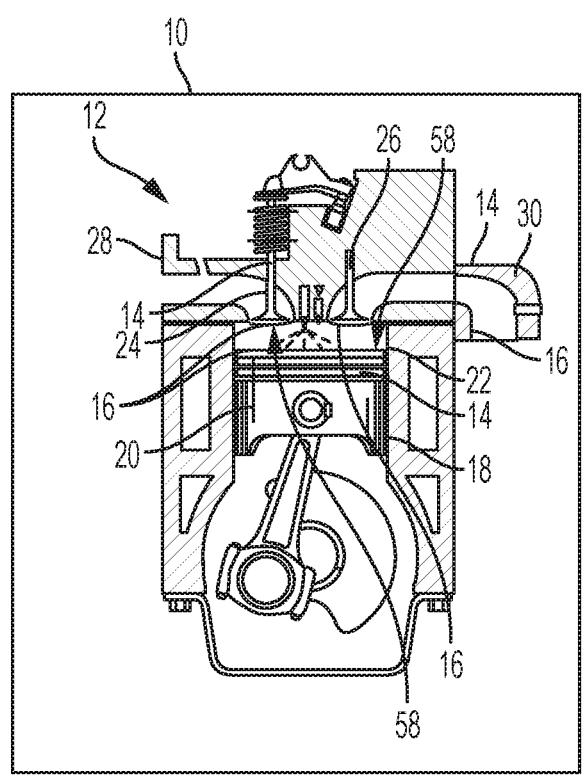
FIG. 1 is a schematic, diagrammatic view of a vehicle illustrating a side view of a single cylinder internal combustion engine having a thermal barrier coating disposed on a plurality of components.

Reference will now be made in detail to several embodiments of the disclosure that are illustrated in accompanying drawings. Whenever possible, the same or similar reference numerals are used in the drawings and the description to refer to the same or like parts or steps. The drawings are in simplified form and are not to precise scale. For purposes of convenience and clarity only, directional terms such as top, bottom, left, right, up, over, above, below, beneath, rear, and front, may be used with respect to the drawings. These and similar directional terms are not to be construed to limit the scope of the disclosure in any manner.

Referring to the drawings, wherein like reference numbers correspond to like or similar components throughout the several Figures, a portion of a vehicle 10 with a propulsion system 12 in accordance with an exemplary embodiment of the disclosure is shown schematically in FIG. 1. The propulsion system 12 may be any of an internal combustion engine, fuel cells, motors and the like. The propulsion system 12 may be part of the vehicle 10 that may include a motorized vehicle, such as, but not limited to, standard passenger cars, sport utility vehicles, light trucks, heavy duty vehicles, minivans, buses, transit vehicles, bicycles, robots, farm implements, sports-related equipment or any other transportation apparatus. For purposes of clarity, propulsion system 12 will be referred to hereinafter as an internal combustion engine or engine 12.

The engine 12 of vehicle 10 may include one or more components 14. The component 14 has a thermal barrier coating (TBC) 16 of the type disclosed herein, applied thereto. In one embodiment of the disclosure, TBC 16 may include a composite or multi-layer structure or configuration. While the vehicle 10 and the engine 12 of FIG. 1 are a typical example application, suitable for the TBC 16 disclosed herein, the present design is not limited to vehicular and/or engine applications.

Any stationary or mobile, machine or manufacture, in which a component thereof is exposed to heat may benefit from use of the present design. For illustrative consistency, the vehicle 10 and engine 12 will be described hereinafter as an example system, without limiting use of the TBC 16 to such an embodiment.

FIG. 1 illustrates an engine 12 defining a single cylinder 18. However, those skilled in the art will recognize that the present disclosure may also be applied to components 14 of engines 12 having multiple cylinders 26. Each cylinder 18 defines a combustion chamber 22. The engine 12 is configured to provide energy for propulsion of the vehicle 10. The engine 12 may include but is not limited to a diesel engine or a gasoline engine. The engine 12 further includes an intake assembly 28 and an exhaust manifold 30, each in fluid communication with the combustion chamber 22. The engine 12 includes a reciprocating piston 20, slidably movable within the cylinder 18.

The combustion chamber 22 is configured for combusting an air/fuel mixture to provide energy for propulsion of the vehicle 10. Air may enter the combustion chamber 22 of the engine 12 by passing through the intake assembly 28, where airflow from the intake manifold into the combustion chamber 22 is controlled by at least one intake valve 24. Fuel is injected into the combustion chamber 22 to mix with the air, or is inducted through the intake valve(s) 32, which provides an air/fuel mixture. The air/fuel mixture is ignited within the combustion chamber 22. Combustion of the air/fuel mixture creates exhaust gas, which exits the combustion chamber 22 and is drawn into the exhaust manifold 30. More specifically, airflow (exhaust flow) out of the combustion chamber 22 is controlled by at least one exhaust valve 26.

Figure 2:
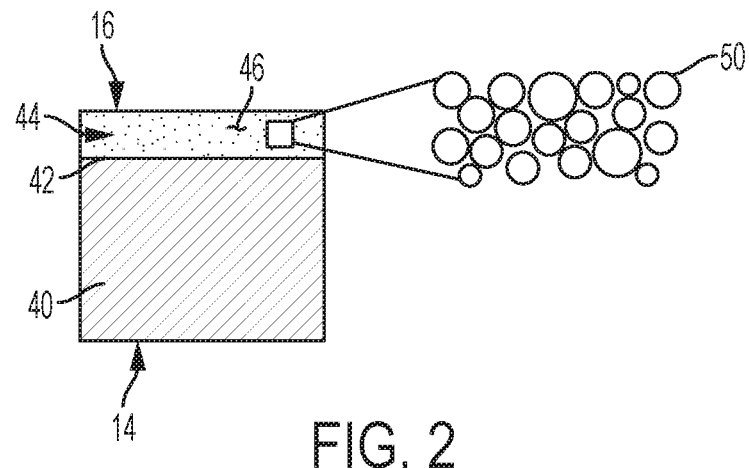
FIG. 2 is a schematic cross-sectional side view of the thermal barrier coating disposed on the component.

With reference to FIGS. 1 and 2, the TBC 16 may be disposed on a face or surface of one or more of the components 14 of the engine 12, including, but not limited to, the piston 20, the intake valve 24, exhaust valve 26, interior walls of the exhaust manifold 30, and the like. In one embodiment of the disclosure, the TBC 16 may be applied onto high temperature sections or components of the engine 12 and bonded to the component 14 to form an insulator configured to reduce heat transfer losses, increase efficiency, and increase exhaust gas temperature during operation of the engine 12.

The TBC 16 is configured to provide low thermal conductivity and low heat capacity to increase engine efficiency. As such, the low thermal conductivity reduces heat transfer losses and the low heat capacity means that the surface of the TBC 16 tracks with the temperature of the gas during temperature swings and heating of cool air entering the cylinder is minimized. In one non-limiting embodiment of the disclosure, the TBC 16 may be about 200 microns ($\mu m$) in thickness that is applied to a surface 42 of the component 14 which exhibits a calculated thermal conductivity of about 0.09 W/mK and heat capacity of 240 kJ/m$^3$K to minimize heat losses and increase engine efficiency. It should be appreciated that the TBC 16 may be applied to components other than present within the engine 12. More specifically, the TBC 16 may be applied to components of spacecraft, rockets, injection molds, and the like.

Referring now to FIG. 2, each component 14 includes a substrate 40 having at least one exterior or presenting surface 42. The TBC 16 may include at least one layer 44 that is applied and/or bonded to the surface 42 of the substrate 40. The at least one layer 44 of the TBC 16 may include multiple layers, such as a first or insulating layer 46 and a second or sealing layer 48.

The insulating layer 46 may include a plurality of microspheres 50, sintered together to create a layer having an extremely high porosity and mostly closed celled structure. Preferably, the porosity of the insulating layer 46 may be at least about 75% and, more particularly, a porosity of between about 75% and about 95%. The high porosity of the insulating layer 46 provides for a corresponding volume of air and/or gases to be contained therein, thus providing the desired insulating properties of low effective thermal conductivity and low effective heat capacity.

It is contemplated that the higher the volume fraction of porosity in the insulating layer 46, the lower the thermal conductivity and capacity. The porosity level needs to be balanced with the mechanical requirements, such as compressive strength, which is required to withstand the high pressure levels in the engine 12. The thickness T1 of the insulating layer may be between about 50 microns or micrometers ($\mu \mu m$) and about 1000 $\mu m$ or 1 millimeter (mm). The thickness T2 of the sealing layer 48 may be between about 1 $\mu m$ and about 20 $\mu m$. The insulating layer 46 is configured to withstand surface temperatures of at least 1,000 degrees Celsius (° C.).

The microspheres 50 may be comprised of a combination of polymeric, metal, glass, and/or ceramic materials. In one non-limiting embodiment, the microspheres 50 are formed using ceramics such as glass bubbles or cenospheres such as Finite® and the like for durability and resistant to oxidation and corrosion at high temperatures. The microspheres 50 may have a diameter D1 of between about 10 $\mu m$ and about 100 $\mu m$ and a shell thickness that is about 2% to about 5% of the diameter of the microsphere 50.

In one embodiment of the disclosure, ceramic microspheres 50 may comprise about 0 percent by weight to about 100 percent by weight of silicon oxide ($SiO_2$) and about 0 percent by weight to about 100 percent by weight of aluminum oxide ($Al_2O_3$). Alternatively, the plurality of ceramic microspheres may comprise about 50 percent by weight to about 70 percent by weight of silicon oxide and about 30 percent by weight to about 50 percent by weight of aluminum oxide to achieve a higher melting point.

Alternatively, aluminum oxide, or other oxides or ceramics may be used to form microspheres 50 if the material has sufficient high temperatures capability and a coefficient of thermal expansion (CTE) greater than 8 ppm/C. Non-limiting exemplary materials may include yttria stabilized zirconia, rare earth zirconate pyrochlores and rare earth titanate pyrochlores where the rare earth is selected from the group consisting of: Yttrium (Y), Lanthanum (La), Cerium (Ce), Praseodymium (Pr), Neodymium (Nd), Samarium (Sm), Europium (Eu), Gadolinium (Gd), Terbium (Tb), Dyprosium (Dy), Holmium (Ho), Erbium (Er), Thulium (Tm), Ytterbium (Yb) and Lutetium (Lu).

The microspheres 50 may be sorted by one or more physical factors, such as by size or density, to achieve a targeted size distribution. In one non-limiting embodiment, an average diameter of a microsphere 50 would be about one-fourth of the thickness of the TBC 16, though it is understood that the microsphere 50 diameter would be smaller for a thinner TBC 16. For example, microspheres 50 may be sorted and selected having a diameter of about 10 microns to about 50 microns.

Figure 3A:
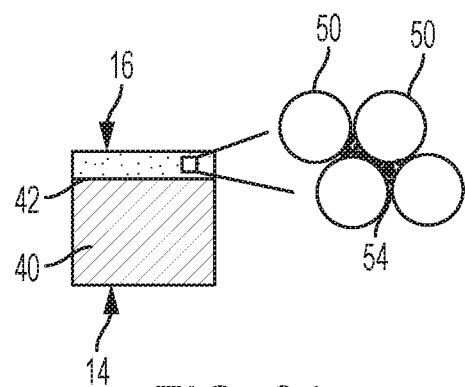
FIGS. 3A-3B are schematic cross-sectional side views of bonded microspheres of the thermal barrier coating as applied to a substrate of the component.
Figure 3B:
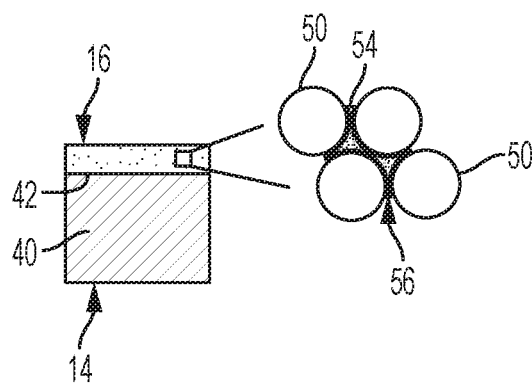

Referring to FIGS. 3A and 3B, in one embodiment of the disclosure, microspheres 50 may be combined with particles 54 of a matrix forming alloy, generally referred to by numeral 56. FIG. 3A illustrates a portion of the TBC 16 prior to heating, wherein particles 54 are positioned in cavities between adjacent microspheres 50. Particles 54 combine in matrix 56 with microspheres 50 to increase structural durability and robustness of the insulating layer 46.

The particles 54 may be of a composition that melts or sinters at a lower temperature than the microspheres 50 to fuse adjacent microspheres 50 together and with the surface 42 of the substrate 40 with the matrix 56 without deforming or damaging the microspheres 50. If the melting point of the particles 54 is below about 1,000 degrees Celsius (° C.), a standard propulsion system operating temperature, particles 54 may alloy with either the microspheres 50 or another material to form the matrix 56 with a melting point greater than 1,000 degrees Celsius (° C.).

Particles 54 may comprise a ceramic or glass, such as boron trioxide, aluminum oxide, aluminum silicate, silica, silicate glass or mixtures thereof which have a lower melting point than the hollow spheres and promote sintering and bonding. Alternatively the particles 54 may comprise a metal, such as Aluminum or an aluminum alloy, which melts at a temperature below 1,000 degrees Celsius (° C.) to fuse the microspheres 50 and convert by oxidation to an aluminum oxide. Alternatively, the particles 54 may comprise a metal nitrate or metal alkoxide precursor, such as aluminum nitrate or titanium isopropoxide or tetraethyl orthosilicate, that may be pyrolyzed to an oxide, for example aluminum oxide or titanium oxide or silicon oxide. In this embodiment, microspheres 50 are mixed with a solution of the metal nitrate or alkoxide precursor or with the pure precursor.

In yet another alternative embodiment, particles 54 may comprise a preceramic polymer such as siloxanes, silanes, carbosilanes, silazanes, borosilanes and similar molecules that are pyrolyzed to an oxide. It is contemplated that a size distribution of particles 54 for use in matrix 56 may be defined. In one embodiment, any particles 54 that are less than about one-tenth the thickness of the coating or greater than about one-third of the coating thickness may be excluded from the matrix to ensure the structural durability and robustness of the matrix by avoiding large interstices between microspheres 50.

Referring back to FIG. 2, application of the first or insulating layer 46 to the surface 42 of the substrate 40 is described in greater detail. Microspheres 50 are placed in a slurry. The slurry may include, as a powder finer than the size of microspheres 50, additives to facilitate sintering via chemical reaction, diffusion, or alloying, and the rheology may be adjusted by addition of appropriate amount of solvent, binders, lubricants, coagulants, and/or antiflocculants to minimize and/or remove carbonaceous or other contaminants left over which may affect with a sintering process or the final coating composition.

The slurry may be formed of a solvent, such as water, a water soluble binder, for example hydroxy-propyl cellulose, polyvinyl-alcohol, polyvinyl-pyrrolidone or cellulose polymer derivatives and boron trioxide as a sintering aid. Alternatively, the binder may include an organic polymer such as polyvinyl-alcohol, polyvinyl-pyrrolidone or cellulose polymer derivatives which are used in concentrations from about 0.1% by weight and about 8% by weight that is mostly removed during the subsequent heat treatments. An organic solvent such as isopropanol or acetone can also be added to water or fully substituted for the solvent in which case the binder must be suitably soluble in the mixture, such as a polyvinyl butyral resin.

Other slurry additives, for example polyethylene-glycol and glycerol, may be used for rheological adjustments such as deflocculation, lubrication, and antifoaming to maximize the packing efficiency upon slurry application. Preferably the slurry is fluidized for application by addition of just enough solvent to flow smoothly over the surface 42 of substrate 40, for example about 10 milliliters (ml) for 10 grams (g) of dry microspheres 50 and a minimum amount of binder is also added to reduce residual carbon after burnout.

The volume fraction of the matrix 56 in the coating is about 5% to about 20%, whereby lower volume fractions may result in a higher overall coating porosity. The matrix 56 may also seal the TBC 16 from ingress of carbonaceous combustion residue that can fill up open porosity in the TBC 16, thereby increase thermal conductivity and capacity. A high volume fraction of matrix 56 at the surface of the coating creates a dense layer that inhibits ingress of combustion gases and residue, with a volume fraction of the matrix 56 in the coating of about 3% to about 20%. Alternatively, a lower volume fraction of matrix 56 may be formed to decrease thermal conductivity and capacity by initially limiting the matrix fraction to form the coating and then applying a thin layer of extra matrix material to the top of the coating, wherein the volume fraction of the matrix 56 in this dense matrix of about 10 µm to about 100 µm is about 20% to about 40%.

The first or insulating layer 46 may be formed by applying a slurry of the microspheres 50 to the surface 42 of substrate 40 of the component 14. The slurry may be applied as a spray coating to the surface 42 of the substrate 40 via a pressurized spray gun that is adjusted to distribute a uniform coating of slurry onto the surface 42. Alternatively, microspheres 50 in slurry may be blade coated or doctor bladed on the surface 42 of substrate 40 and thereby sintered for about 2 hours at about 850 degrees Celsius (° C.).

As discussed above, the oxide or metal particles 54 may be mixed with the microspheres 50 and a solvent and additives to form a slurry. A coating of the slurry is applied to the surface 42 of substrate 40, dried and heat treated to form the TBC 16. The slurry on the surface 42 of substrate 40 may be heat treated in two stages. The first stage may be a low temperature drying process to remove excess solvent slowly enough to avoid formation of cracks. Preferred temperatures range from about 20 degrees Celsius (° C.) to about 250 degrees Celsius (° C.). The second stage may be a melting or sintering step to fuse the microspheres 50 to each other and the surface 42 of substrate 40 to improve structural integrity in a temperature range from about 700 degrees Celsius (° C.) to about 900 degrees Celsius (° C.).

In another embodiment, a coating of the resulting slurry is applied to the surface 42 of substrate 40, dried and heat treated to pyrolyze the precursor into an oxide. In yet another embodiment, preceramic monomers may be mixed with a solvent to create a liquid that can be mixed with the microspheres 50. This slurry can then be applied as a coating to the surface 42 of substrate 40. After letting the solvent evaporate, the monomer/microsphere coating is then cured, either by UV light exposure or by thermal annealing. The curing crosslinks the monomers and forms a rigid polymer matrix. This polymer matrix is then pyrolyzed in air or inert atmosphere to a ceramic, for example 1,000 degrees Celsius (° C.) in argon, exact pyrolysis conditions depend on the preceramic polymer.

Figure 4A:
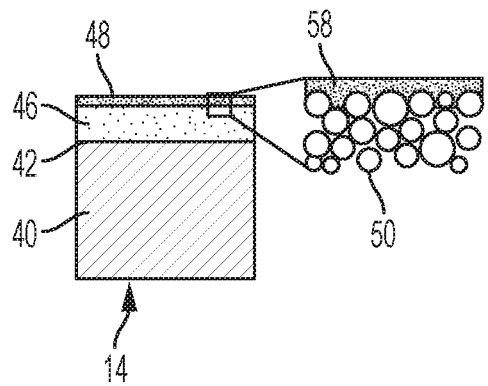
FIGS. 4A-4B are schematic cross-sectional side views of the thermal barrier coating with a sealing layer disposed on the component illustrating the thermal barrier coating applied to the substrate.
Figure 4B:
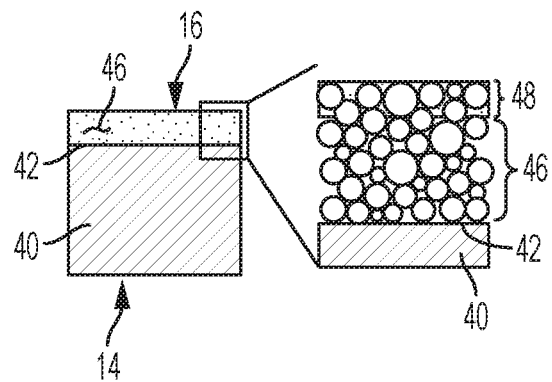

Referring now to FIGS. 4A and 4B, the sealing layer 48 is disposed over the insulating layer 46, such that the insulating layer 46 is disposed between the sealing layer 48 and the surface 42 of the substrate 40 of the component 14. The sealing layer 48 may be a mostly non-permeable, dense, thin film sitting on top of the insulating layer comprising the microspheres as in FIG. 4A, or it could be a mostly non-permeable layer that contains microspheres as in FIG. 4B. More specifically, the sealing layer 48 comprises material that is configured to withstand temperatures of around 1,100 degrees Celsius (° C.). The sealing layer 48 may be configured to be a thickness of about 1 μm to about 20 μm. The sealing layer is preferably formed from materials including aluminum oxide, aluminum silicate, silicon oxide, silicate glass or mixtures thereof. Alternatively the sealing layer can be formed from high temperature metals or metal alloys such as nickel, cobalt, iron, chromium, refractory metals and their alloys. Alternatively the sealing layer can be formed from a preceramic polymer consisting of the group selected from siloxanes, silanes, carbosilanes, silazanes and borosilanes that converts to a ceramic on heat treatment of the insulating layer.

The sealing layer 48 may be non-permeable to combustion gases, such that a seal is provided between the sealing layer 48 and the insulating layer 46. Such a seal prevents debris from combustion gases, such as unburned hydrocarbons, soot, partially reacted fuel, liquid fuel, and the like, from entering the porous structure defined by the microspheres 50. If such debris were allowed to enter the porous structure of the insulating layer 46, air disposed in the porous structure would end up being displaced by the debris, and the insulating properties of the insulating layer 46 would be reduced or eliminated.

The sealing layer 48 may be configured to present an outer surface 58 that is smooth. Having a smooth sealing layer 48 may be important to prevent the creation of turbulent airflow as the air flows across the outer surface 58 of the sealing layer 48. Further, having a sealing layer 48 with a smooth surface will prevent an increased heat transfer coefficient. In one non-limiting example, the sealing layer 48 may be applied to the insulating layer 46 via electroplating. In another non-limiting example, the sealing layer 48 may be applied to the insulating layer simultaneously with sintering the insulating layer 46.

The sealing layer 48 is configured to be sufficiently resilient so as to resist fracturing or cracking during exposure to debris. Further, the sealing layer 48 is configured to be sufficiently resilient so as to withstand any expansion and/or contraction of the underlying insulating layer 46. Further, the insulating and sealing layers 46, 48 are each configured to have compatible coefficient of thermal expansion characteristics to withstand thermal fatigue.

In one embodiment of the disclosure, TBC 16 may include cenospheres formed as ceramic microspheres 50 having a composition of about 50% by weight to about 60% by weight silicon oxide, about 34% by weight to about 42% by weight aluminum oxide and less than 2% iron oxide ($Fe_2O_3$). The microspheres 50 are mixed with aluminum oxide and boron trioxide ($B_2O_3$) particles 56 as matrix forming material in the ratio of about 0% by weight to about 50% by weight, preferably about 10% by weight to about 20% by weight, of the mass of the microspheres 50 to provide a liquid phase and depress the melting temperature of the microsphere 50 coating sufficiently to enable forming a TBC 16 on a stainless steel surface 42 of the substrate 40 of the component 14.

A slurry is formed with microspheres 50, aluminum oxide and boron trioxide particles 56 and about 1% by weight to about 2% by weight of hydroxypropyl-cellulose added as a binder. Water is added to the mixture to achieve a low viscosity. This slurry is sprayed with a spray gun onto the surface 42 of the substrate 40, dried in an oven at about 125 degrees Celsius (° C.) and subsequently sintered in air at about 725 degrees Celsius (° C.) for 2 hours.

A method for applying a thermal barrier coating (TBC) 16 to a surface 42 of a substrate 40 of a component 14 is described in greater detail. The method includes providing a plurality of ceramic microspheres. The plurality of ceramic microspheres may be sorted such that ceramic microspheres having a diameter of about 10 microns to about 100 microns, preferably about 10 microns to about 50 microns, are selected for use.

Particles 54 of the matrix 56 may be added to the selected microspheres 50. Particles 54 may include a variety of mixtures and may be added at a weight fraction of about 5% by weight to about 50% by weight of the microspheres 50. In one embodiment, the matrix 56 mixture may include boron oxide and about 0% by weight to about 50% by weight of aluminum oxide. In another embodiment, matrix 56 mixture may include a borosilicate glass. In yet another embodiment, the matrix 56 mixture may include an aluminum metal or an aluminum alloy, which is melted to fuse the microspheres 50 together and subsequently oxidized to an oxide matrix 56.

In yet another embodiment, the matrix 56 mixture may include silica precursors including tetraethyl orthosilicate, which fuses the microspheres 50 together and is subsequently pyrolyzed to an oxide matrix. In another embodiment, the matrix 56 mixture may include preceramic precursors including siloxanes, silanes, carbosilanes, silazanes, borosilanes and similar molecules and mixtures thereof, that are subsequently crosslinked by thermal or UV cure and then pyrolyzed in an inert atmosphere to a ceramic matrix 56.

A slurry is prepared with the plurality of ceramic microspheres 50, matrix 56 and at least one of a solvent and a binder as described above. The slurry is applied to the surface 42 of the substrate 40 of the component 14 using a process from the group consisting of spraying, dipping painting and doctor-blading. At least one heat treatment is applied to the slurry and the surface 42 of the component 14. The at least one heat treatment may include drying the slurry and surface 42 of component 14 in an oven at about 125 degrees Celsius (° C.) and subsequently sintering the slurry and component 14 in air at about 725 degrees Celsius (° C.) for 2 hours. A non-permeable sealing layer 48 may be bonded to the slurry such that the non-permeable sealing layer 48 seals against the slurry.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A thermal barrier coating comprising:
   an insulating layer applied to a surface of a substrate having a thickness of between about 50 microns and about 1 millimeter, wherein the insulating layer comprises a plurality of ceramic microspheres and a porosity of at least 75%; and
   a sealing layer bonded to the insulating layer, wherein the sealing layer is non-permeable such that the sealing layer seals against the insulating layer.

2. The thermal barrier coating of claim 1 wherein the insulating layer further comprises a matrix material configured to bond with the plurality of microspheres.

3. The thermal barrier coating of claim 2 wherein the matrix material further comprises boron trioxide, aluminum oxide, aluminum silicate, silica, or silicate glass or mixtures thereof.

4. The thermal barrier coating of claim 2 wherein the matrix material further comprises a preceramic polymer consisting of the group selected from siloxanes, silanes, carbosilanes, silazanes and borosilanes.

5. The thermal barrier coating of claim 1 wherein the diameter of each of the plurality of ceramic microspheres is between about 10 microns and about 100 microns.

6. The thermal barrier coating of claim 1 wherein the plurality of ceramic microspheres further comprise about 0 percent by weight to about 100 percent by weight of silicon oxide and about 0 percent by weight to about 100 percent by weight of aluminum oxide.

7. The thermal barrier coating of claim 1 wherein the plurality of ceramic microspheres further comprise about 50 percent by weight to about 70 percent by weight of silicon oxide and about 30 percent by weight to about 50 percent by weight of aluminum oxide.

8. The thermal barrier coating of claim 1 wherein the sealing layer may comprise one or more elements selected from the group consisting of: aluminum oxide, aluminum silicate, silicon oxide, silicate glass or mixtures thereof, high temperature metals and metal alloys including nickel, cobalt, iron, chromium, refractory metals and corresponding alloys.

9. The thermal barrier coating of claim 1 wherein the sealing layer may be formed from a preceramic polymer comprising one or more elements selected from the group consisting of: siloxanes, silanes, carbosilanes, silazanes and borosilanes, wherein the preceramic polymer converts to a ceramic upon heat treatment of the insulating layer.

* * * * *